United States Patent
Namba et al.

(10) Patent No.: US 7,255,744 B2
(45) Date of Patent: Aug. 14, 2007

(54) LOW-RESISTIVITY N-TYPE SEMICONDUCTOR DIAMOND AND METHOD OF ITS MANUFACTURE

(75) Inventors: Akihiko Namba, Itami (JP); Takahiro Imai, Itami (JP); Hisao Takeuchi, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 329 days.

(21) Appl. No.: 10/506,493

(22) PCT Filed: Dec. 22, 2003

(86) PCT No.: PCT/JP03/16492

§ 371 (c)(1),
(2), (4) Date: Sep. 3, 2004

(87) PCT Pub. No.: WO2004/061167

PCT Pub. Date: Jul. 22, 2004

(65) Prior Publication Data

US 2005/0217561 A1 Oct. 6, 2005

(30) Foreign Application Priority Data

Dec. 27, 2002 (JP) ............................. 2002-379229

(51) Int. Cl.
*C30B 29/13* (2006.01)

(52) U.S. Cl. .................. 117/89; 117/104; 117/105; 117/107; 117/929; 423/446

(58) Field of Classification Search .............. 117/89, 117/104, 105, 107, 929; 423/446
See application file for complete search history.

(56) References Cited

U.S. PATENT DOCUMENTS

| | | | |
|---|---|---|---|
| 5,508,208 A | | 4/1996 | Sato |
| 5,541,423 A | * | 7/1996 | Hirabayashi .................. 257/77 |
| 6,414,338 B1 | * | 7/2002 | Anderson ..................... 257/77 |

(Continued)

FOREIGN PATENT DOCUMENTS

EP  0-646-968 A1  4/1995

(Continued)

OTHER PUBLICATIONS

R. Kalish, "The search for donors in diamond," Diamond and Related Materials, vol. 10 (2001), pp. 1749-1755.

(Continued)

*Primary Examiner*—Robert Kunemund
(74) *Attorney, Agent, or Firm*—James W. Judge

(57) ABSTRACT

Concerns lithium-doped diamond: Low-resistivity n-type semiconductor diamond doped with lithium and nitrogen, and a method of manufacturing such diamond are provided.

Low-resistivity n-type semiconductor diamond containing $10^{17}$ cm$^{-3}$ or more of lithium atoms and nitrogen atoms together, in which are respectively doped lithium atoms into carbon-atom interstitial lattice sites, and nitrogen atoms into carbon-atom substitutional sites, with the lithium and the nitrogen holding arrangements that neighbor each other. To obtain low-resistivity n-type semiconductor diamond, in a method for the vapor synthesis of diamond, photodissociating source materials by photoexcitation utilizing vacuum ultraviolet light and irradiating a lithium source material with an excimer laser to scatter and supply lithium atoms enables the diamond to be produced.

13 Claims, 1 Drawing Sheet

U.S. PATENT DOCUMENTS

| | | | |
|---|---|---|---|
| 6,756,086 B2* | 6/2004 | Hasegawa et al. | 427/523 |
| 2001/0043903 A1* | 11/2001 | D'Evelyn et al. | 423/446 |
| 2006/0177962 A1* | 8/2006 | Namba et al. | 438/105 |

FOREIGN PATENT DOCUMENTS

| | | |
|---|---|---|
| JP | S60-112697 A | 6/1985 |
| JP | S61-236691 A | 10/1986 |
| JP | S62-212297 A | 9/1987 |
| JP | H03-205398 A | 9/1991 |
| JP | H04-174517 A | 6/1992 |
| JP | H04-175295 A | 6/1992 |
| JP | H07-069794 A | 3/1995 |
| JP | H07-106266 A | 4/1995 |
| JP | H10-247624 A | 9/1998 |
| JP | H11-054443 A | 2/1999 |
| JP | H11-214321 A | 8/1999 |
| WO | WO 92/01314 | 1/1992 |

OTHER PUBLICATIONS

J-N Hang, et al., "Investigation of n-Type Doping of Diamond," Journal of Hebei University, Mar. 2002, pp. 87-91, vol. 22 No. 1, Boading, China.

G. Popovici, et al., "Problems of the n-Type Diamond Doping," Diamond-Film Semiconductors, 1994, pp. 99-107, vol. 2151, SPIE, WA.

G. Popovici, et al., "Prospective n-Type Impurities and Methods of Diamond Doping," Daimond and Related Materials 4, 1995, pp. 1305-1310, Elsevier, NY.

* cited by examiner

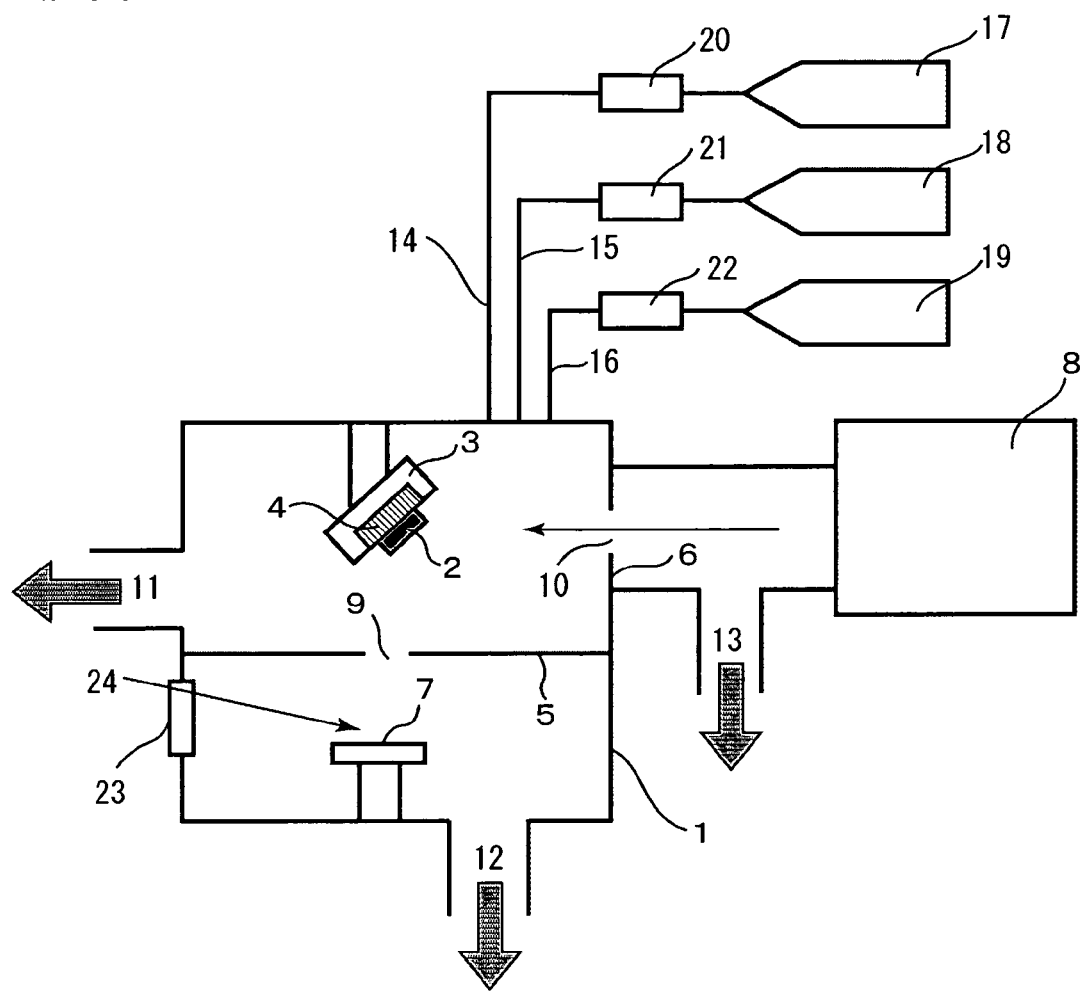
FIGURE

LOW-RESISTIVITY N-TYPE SEMICONDUCTOR DIAMOND AND METHOD OF ITS MANUFACTURE

TECHNICAL FIELD

The present invention relates to low-resistivity n-type semiconductor diamond doped with both lithium and nitrogen, and to methods of manufacturing such diamond. More particularly lithium atoms are doped into carbon-atom interstitial lattice sites in single-crystal diamond, and nitrogen atoms into carbon-atom substitutional sites therein, with the dopants holding neighboring arrangements. The present invention then relates to a method of manufacturing by vapor synthesis the inventive low-resistivity n-type semiconductor diamond—by vapor synthesis that relies on photo-dissociating the precursor using vacuum ultraviolet light.

BACKGROUND ART

Diamond has been employed as a semiconductor material for some time, and research into its practical application as a basis for semiconductor devices is ongoing.

In diamond, with its extraordinarily large bandgap of 5.5 eV, no intrinsic gap—in which carrier conduction is forbidden—as a semiconductor exists at temperatures of 1400° C. or less. And since the dielectric constant of diamond is a small 5.7, its breakdown electric field is a large $5\times10^6$ $V \cdot cm^{-1}$. Moreover, the carrier mobility for electrons/protons alike is a high 2000 $cm^2/V \cdot s$. Diamond also has an unusual property in that its electron affinity is negative. Having electrical characteristics such as these, diamond can be expected to produce such semiconductor devices as power devices that can withstand being operated at high frequency and high output power under high temperatures, light-emitting devices that enable the emission of ultraviolet rays, as well as electron-discharging devices that can be driven at low voltage.

In order to employ diamond as a material for semiconductor devices, the form of its electrical conductivity, p-type or n-type, must be controlled. By adding boron as an impurity into diamond crystal, p-type semiconductor diamond can be obtained. Diamond exists in nature as a p-type semiconductor, and p-type semiconductor diamond can by synthesized relatively easily by introducing gas containing boron atoms into a source-material gas using a chemical vapor synthesis (a CVD) method.

On the other hand, n-type semiconductor diamond does not exist in nature, and although its synthesis has until recently proven elusive, lately single-crystal n-type semiconductor diamond of comparatively favorable crystal quality has been obtained by optimizing the synthesizing conditions in a microwave-plasma CVD technique with phosphorous and sulfur as dopants. What is more, by combining n-type semiconductor diamond doped with the phosphorous and sulfur dopants, with p-type semiconductor diamond doped with boron, pn junctions are being formed to prototype UV-emitting LEDs.

Nevertheless, among single-crystal n-type semiconductor diamond of favorable crystal quality, even in the best-performing phosphorous-or sulfur-doped n-type semiconductor diamond, the resistivity at room temperature is at the $10^4$ $\Omega \cdot cm$ level, which is so high compared with the resistance of other semiconductor materials as to put the diamond into the insulator category. Moreover, given that the dependence of the resistivity of these n-type semiconductor diamonds on temperature is considerable because their activation energy is extraordinarily large—for the phosphorous-doped diamond it is approximately 0.6 eV, and for the sulfur-doped it is approximately 0.4 eV—across a wide temperature range, stable application of devices employing these n-type semiconductor diamonds has been problematic.

Furthermore, the covalent radius of the carbon atoms constituting diamond is 0.077 nm, whereas the covalent radius of phosphorous is 0.106 nm, and the covalent radius of sulfur is 0.102 nm. Inasmuch as the covalent radii of phosphorous and sulfur are appreciably large compared with the covalent radius of carbon, a problem in situations in which vapor synthesis is carried out while doping with phosphorous and sulfur has been that if diamond is vapor-deposited to a thickness on the order of 10 μm or more, cracks appear in the deposited diamond.

Other than phosphorous and sulfur, dopants with which n-type semiconductor characteristics have been experimentally verified include nitrogen, but with the activation energy of diamond that has been doped with nitrogen being approximately 1.7 eV, and the electrical resistivity at room temperature being $10^{10}$ $\Omega \cdot cm$ or more, nitrogen-doped diamond is an insulator.

Meanwhile, it is known that diamond into which lithium is added will exhibit n-type semiconductor characteristics. For example, Japanese Unexamined Pat. App. Pub. Nos. H03-205398, H04-175295, and H11-54443 disclose techniques wherein by means of a hot-filament CVD method or various plasma CVD methods, with lithium or else water or a liquid organic compound—either of which contains a lithium compound—as a source material, or otherwise in which lithium or a lithium compound is vaporized and introduced into the deposition reactor, lithium is doped during the vapor deposition of diamond to produce low-resistivity n-type semiconductor diamond.

Nonetheless, problems with these methods have been that stable electrical properties cannot be achieved because the lithium moves around within the diamond, and that during the vapor deposition of diamond, what with the lithium bonding with hydrogen that is incorporated at the same time, the lithium is not electrically activated.

In another example, a technique for obtaining low-resistivity n-type semiconductor diamond by introducing lithium into the diamond lattice interstices is disclosed in Japanese Unexamined Pat. App. Pub. No. H07-106266. This technique is a method in which, with a nitrogenous compound of lithium as a source material, an ECR plasma is used to dope lithium into diamond without damaging its crystal quality. With this method, however, inasmuch as the ionic diameter of lithium (0.060 nm) and the ionic diameter of nitrogen (0.027 nm) are each smaller than the covalent diameter of carbon (0.077 nm), lithium and nitrogen both can enter into the diamond lattice interstices without damaging its crystalline structure. A large amount of lithium and nitrogen ends up being doped into the diamond lattice interstices, yet with this method the density at which the lithium and nitrogen are incorporated is not readily controlled. A further problem with the nitrogen has been that though it is doped into the lattice interstices, it does not become activated as an n-type dopant at all; the nitrogen doped in large quantity in the lattice interstices drastically deteriorates the n-type semiconductor characteristics such that the low-resistivity n-type semiconductor properties sought cannot be achieved.

DISCLOSURE OF INVENTION

The present invention has been brought about to address the issues noted above. In particular, an object of the present invention is to solve the problems that arise in lithium-doping situations, to afford low-resistivity n-type semiconductor diamond of excellent crystal quality, and a method of manufacturing the diamond.

Low-resistivity n-type semiconductor diamond of the present invention contains $10^{17}$ cm$^{-3}$ or more of lithium atoms and nitrogen atoms together. The lithium-atom concentration $C_{Li}$ and the nitrogen-atom concentration $C_N$ are preferably $0.1 \leq C_{Li}/C_N \leq 10.0$. It is also preferable that the low-resistivity n-type semiconductor diamond be a single-crystal diamond. Then preferably, into interstitial lattice sites between carbon atoms constituting the diamond, lithium atoms are doped, and into sites where they replace the carbon atoms, nitrogen atoms are, with the lithium atoms and the nitrogen atoms holding arrangements that neighbor each other, wherein it is preferable that the separation between the centers of the lithium atoms and nitrogen atoms be 0.145 nm or more but 0.155 nm or less. The activation energy of the low-resistivity n-type semiconductor diamond of the present invention is then 0.05 eV or more but 0.2 eV or less, while its resistivity is $10^3 \Omega \cdot$cm or less.

A method of manufacturing low-resistivity n-type semiconductor diamond of the present invention onto a substrate by a vapor synthesis technique is characterized in photo-dissociating a source material by photoexcitation utilizing vacuum ultraviolet light. Preferably an oxide of lithium set inside a chamber is irradiated with an excimer laser beam to scatter lithium atoms from it and have them arrive near the substrate.

Furthermore, the nitrogen and carbon source materials are in gaseous form, with their supply quantities being $0.001 \leq$ nitrogen amt./carbon amt. $\leq 0.1$ and the nitrogen source material being nitrogen gas or ammonia. The wavelength of the foregoing vacuum ultraviolet light preferably is 65 nm or more but 75 nm or less. Also preferable is that during the foregoing vapor synthesis the pressure be 1330 Pa or more but 20,000 Pa or less, and that the substrate temperature be 100° C. or more but 1000° C. or less.

BRIEF DESCRIPTION OF DRAWING

The figure illustrates one example of a diamond-synthesizing apparatus utilized in the present invention.

BEST MODE FOR CARRYING OUT THE INVENTION

The present inventors discovered that in order to obtain low-resistivity n-type semiconductor diamond of favorable crystal quality the diamond should be doped simultaneously with $10^{17}$ cm$^{-3}$ or more of both nitrogen (covalent radius: 0.074 nm) possessing a covalent radius smaller than the covalent radius (0.077 nm) of the carbon constituting the diamond, and lithium (ionic radius: 0.060 nm). Therein the ratio $C_{Li}/C_N$ of the lithium-atom concentration $C_{Li}$ to the nitrogen-atom concentration $C_N$ within the low-resistivity n-type semiconductor diamond preferably is 0.1 or more but 10.0 or less. The diamond cannot be lent low resistivity if either the lithium or the nitrogen is less than $10^{17}$ cm$^{-3}$. Likewise, if the ratio $C_{Li}/C_N$ of the lithium-atom concentration to the nitrogen-atom concentration is less than 0.1, the temperature dependence of the resistivity proves to be as great as doping with nitrogen alone. By the same token, if the ratio exceeds 10.0, stabilized electrical properties in the diamond cannot be achieved because the lithium moves around within it.

Although in situations in which diamond is doped with lithium only, the doped lithium moves around in the lattice interstices as discussed earlier, it was discovered that if at the same time the diamond is doped with lithium, nitrogen is doped into sites where it replaces carbon atoms constituting the diamond, the lithium doped into interstitial lattice sites will no longer move, enabling low-resistivity n-type semiconductor diamond of excellent crystal quality to be produced. Therein, the center-to-center distance between the lithium atoms and nitrogen atoms preferably is 0.145 nm or more but 0.155 nm or less. An inter-center separation of less than 0.1456 nm or more than 0.155 nm is prohibitive of doping simultaneously with lithium and nitrogen.

It was discovered that in order to produce a context of this sort for doping, effective in a method of manufacturing low-resistivity n-type semiconductor diamond by vapor synthesis is photoexcitation utilizing vacuum ultraviolet light. In the vapor synthesis of diamond by means of photoexcitation with vacuum ultraviolet light of 65 nm or more but 75 nm or less in wavelength, utilizing the vacuum ultraviolet light to irradiate and photoexcite hydrogen and a carbon-containing source material such as methane, introduced under appropriate temperature and pressure conditions, selectively creates Ch$_3$ radicals and H radicals by photolysis; and in the diamond vapor synthesis, almost no CH$_2$ radicals and CH radicals, which are the cause of crystal defects in the diamond being formed, are created. Crystal defects within the created diamond film are therefore minimal, and thin diamond films of superior quality, in which the incorporation of impurities that differ in crystal quality is minimal can thus be achieved. Synchrotron radiation, an undulator, or an ultra-high-temperature plasma such as a laser plasma can be utilized as the source of vacuum ultraviolet light.

To produce diamond doped with lithium and nitrogen requires supplying a source material of lithium and nitrogen. It was discovered that for a method of supplying lithium, the objective of making it so that, apart from the CH 3 radicals, CH$_2$ radicals and CH radicals that spoil the crystal quality of the diamond are not generated, can be attained by irradiating an oxide of lithium with an excimer laser so as to scatter lithium atoms from the oxide and make them arrive near the substrate, and by having the nitrogen source material be nitrogen gas or ammonia. The foregoing lithium-supply method does not require the conventional facilities for heat vaporization or similar operations in order to introduce a lithium-containing source material into the semiconductor-diamond synthesizing apparatus, and is extremely safe.

The ratio (nitrogen amt./carbon amt.) of the quantity of nitrogen included in the either the nitrogen gas or ammonia gas that is a source-material gas, to the quantity of carbon included within the methane or like carbon-containing gas is preferably 0.001 or more but 0.1 or less. The nitrogen quantity being less than 0.001 of the carbon quantity leads to the nitrogen quantity contained in the formed diamond being meager, which is prohibitive of producing the low-resistivity n-type semiconductor diamond of the present invention. Likewise, if the quantity of nitrogen is greater than 0.1 of the carbon quantity, the quality (crystalline properties) of the formed diamond is compromised.

The pressure during the vapor synthesis is preferably 1330 Pa or more but 20,000 Pa or less. Diamond cannot be formed at a pressure less than 1330 Pa, while if the pressure is more than 20,000 Pa the quality (crystalline properties) of the diamond is compromised. Inasmuch as diamond cannot be formed at a substrate temperature of less than 100° C., while if the temperature exceeds 1000° C. the quality (crystalline properties) of the diamond deteriorates, a formation temperature of 100° C. or more but 1000° C. or less is preferable.

A problem when diamond is doped with lithium in an ordinary apparatus for the vapor synthesis of diamond employing hot-filament CVD or plasma CVD has been that because a large amount of hydrogen is incorporated into the diamond simultaneously with lithium, the doped lithium is not activated, or else the lithium moves around within the diamond, which is prohibitive of obtaining stabilized electrical characteristics. These problems have occurred even in situations in which the diamond is doped simultaneously with lithium and nitrogen. Nevertheless, utilizing photoexcitation by means of vacuum ultraviolet under appropriate temperature and pressure conditions selectively creates $CH_3$ radicals as noted earlier, therefore allowing diamond of extraordinarily favorable crystal quality to be formed. Being able to form diamond of excellent crystal quality means that impurities whose inclusion in substitutional sites is desired are incorporated into the substitutional sites, and impurities whose inclusion in interstitial lattice sites is desired are incorporated into the interstitial lattice sites. The fact that the ionic radius of lithium at 0.060 nm is small by comparison to the 0.077 nm covalent radius of carbon means that when diamond is being vapor synthesized by photoexcitation using vacuum ultraviolet light, simultaneously doping the diamond with lithium will incorporate lithium atoms into the interstitial lattice sites without their being incorporated into the substitutional sites. In turn, with the 0.074 nm covalent radius of nitrogen being close to the covalent radius of carbon, nitrogen will incorporate into the substitutional sites because it loses a single valence electron to form an $sp^3$ bond.

Herein, to predict the activation energy of diamond formed by the above-described method, the formation energy for the situation in which lattice-interstitial doping with lithium and substitutional doping with nitrogen are combined was computed based on a simulation according to an ab initio calculation. In addition, the formation energy for the situation in which lithium atoms and nitrogen atoms are mutual neighbors and are adjacent was calculated according to an ah initio simulation.

As a result, it became clear that with the formation energy for the situation in which the lithium atoms present in the interstitial lattice sites and the nitrogen atoms present in the substitutional sites are adjacent to each other being lower than the situation in which they are apart, the arrangement in which they are adjacent is the most stable. The activation energy for this case was calculated to be 0.10 eV, while the separation between the lithium atoms and the nitrogen atoms in the optimal arrangement was 0.1494 nm.

With the separation between the lithium atoms and the nitrogen atoms being less than 0.145 nm the formation energy is so high that the lithium atoms and the nitrogen atoms are unlikely to be implanted simultaneously within the diamond. By the same token, it was understood that if the separation is longer than 0.155 nm, the activation energy will be larger than 0.10 eV, increasing the resistivity's dependence on temperature.

According to the results of the ah initio calculations as above, it was discovered that if diamond is doped simultaneously with lithium atoms and nitrogen atoms, and the center-to-center distance between the lithium atoms and the nitrogen atoms is 0.145 or more but 0.155 nm or less then the diamond will be a low-resistivity n-type semiconductor. It could be expected that the activation energy of the diamond would be low.

The present invention enables low-resistivity n-type semiconductor diamond doped simultaneously with lithium and nitrogen to be formed.

EMBODIMENT

The figure is a schematic diagram illustrating one example of a diamond-synthesizing apparatus utilized in an embodiment of the present invention.

A diamond substrate 2 is set into a substrate holder 3 within a vacuum chamber 1. The temperature of the diamond substrate 2 can be adjusted by a heating device 4 from room temperature to a temperature of a thousand several hundred degrees. The vacuum chamber 1 is divided by pressure-differential partitions 5 and 6 into a section containing the diamond substrate 2, a section containing a target 7 consisting of lithium oxide, and a section to which a light source 8 is connected. Slits 9 and 10 are provided in the respective pressure-differentiating partitions, and the sections just described are furnished with respective separate vacuum-evacuation ports 11, 12 and 13 in order for pressure-differential evacuation to take place through them. The section containing the diamond substrate 2 is furnished with gas introduction lines 14, 15 and 16 through which the hydrogen, methane and ammonia that are the source gases are introduced. Supply of the source gas is adjusted to respective predetermined flow volumes by master controllers 20, 21 and 22 connected to gas canisters 17, 18 and 19. The section containing the target 7 is furnished with an optical window 23 consisting of quartz, for an excimer laser.

At first the vacuum chamber 1 is evacuated to a vacuum via the vacuum-evacuation ports 11, 12 and 13. Next, via the gas-introduction lines 14, 15 and 16 the source gases are supplied, with their flow volumes adjusted so as to be a predetermined mixing ratio, to the section containing the diamond substrate 2 until it reaches a predetermined pressure. In the section containing the target 7, via the optical window 23 the target 7 is irradiated with an excimer laser beam 24. Lithium atoms are thereupon scattered from the target 7 consisting of lithium oxide, pass the slit 9 provided in the pressure-differentiating partition 5, and arrive in the proximity of the diamond substrate 2. Therein, from the light source 8 a beam having passed through the slit 10 provided in the pressure-differentiating partition 6 irradiates the diamond substrate 2, which has been heated by the heating device 4, photo-dissociates the supplied source gases, and together with the lithium atoms that have flown in from the target 7 promotes a chemical reaction on the diamond substrate 2.

In this way, diamond that has been doped with lithium and nitrogen is grown homoepitaxially on the diamond single-crystal substrate 2, which allows a low-resistivity n-type semiconductor diamond to be formed.

Specific vapor-synthesizing conditions and results of evaluating the formed low-resistivity n-type semiconductor diamond are given below.

Initially, a chamber into which a high-temperature, high-pressure synthesized IIa diamond single-crystal substrate had been set was evacuated down to $133 \times 10^{-9}$ Pa ($10^{-9}$ torr) using a vacuum pump, then diamond was synthesized under the following conditions.

Target: lithium oxide.

Laser that irradiates target: ArF excimer laser. (Intensity: 1 J/cm$^2$.)

Source gases: hydrogen=1000 sccm; methane=10 sccm; ammonia=0.1 sccm.

Diamond substrate temperature: 300° C.

Chamber internal pressure on substrate end: 4000 Pa (30 torr).

Light source: synchrotron radiation device (wavelength=70 nm), 200 mA accumulated current.

Synthesis duration: 2 hours.

After synthesis the diamond single-crystal substrate was taken out, and assays of the material deposited onto the single-crystal substrate were made by scanning electron microscopy (SEM), Raman spectroscopy, and reflection high-energy election diffraction (RHEED). The results confirmed that the material deposited onto the diamond single-crystal substrate was epitaxially grown diamond single crystal. There were no cracks or like damage in the epitaxially grown diamond single crystal.

The obtained epitaxial diamond single crystal was further analyzed by secondary ion mass spectrometry (SIMS), wherein $2.1 \times 10^{18}$ cm$^{-3}$ lithium and $2.2 \times 10^{18}$ cm$^{-3}$ nitrogen were detected. Furthermore, only about the same level of hydrogen as in the substrate—the IIa diamond single crystal—was detected. The SIMS assay confirmed that lithium and nitrogen were contained at about the same level of concentration within the formed epitaxial diamond single crystal, with almost no hydrogen being incorporated therein.

The following analysis was additionally conducted in order to identify the lithium-atom and nitrogen-atom incorporation sites within the epitaxial diamond single crystal.

By carrying out channeling measurements in terms of Rutherford back scattering spectrometry (RBS), particle-induced X-ray emission (PIXE), and nuclear reaction analysis (NRA), respectively, the lithium and nitrogen substitution percentages were calculated. As a result, the substitution percentage of nitrogen proved to be 94% or more, while the substitution percentage of lithium proved to be 5% or less. From the results it was evident that most of the lithium within the diamond was present in lattice interstices, while almost all the nitrogen was present in substitutional sites.

Next the substitutional status was assayed by electron spin resonance (ESR). Inasmuch as nitrogen within artificially synthesized diamond is isolated substitutional, if the nitrogen within the diamond formed according to the present invention is also isolated substitutional, then a signal characteristic of isolated substitutional nitrogen should be detected by the ESR measurement. The result of the measurement was that the isolated substitutional nitrogen proved to be 10% or less of the total nitrogen. From this result it may be inferred that adjacent to the majority of the nitrogen atoms lithium atoms were present.

From the results of the foregoing assays, it was understood that lithium atoms were present in lattice interstitial sites within the diamond crystal, that nitrogen atoms were present in substitutional sites therein, and that the lithium atoms and nitrogen atoms were present in proximate locations.

Next, the electrical characteristics of the epitaxial diamond single crystal formed by the present invention were measured. The surface of the diamond was oxygen-terminated by oxidizing the surface, ohmic-contact electrodes were formed in 4 places on the diamond single crystal after etching away the electrically conductive layer on the diamond surface, and the Hall effect was measured using the van der Pauw method. As a result, it was confirmed that the diamond single crystal was n-type, that its activation energy was 0.11 eV, that its resistivity at room temperature (300 K) was 6.3 Ω cm, and that as diamond it was a low-resistivity n-type semiconductor.

Although the temperature of the diamond single crystal was elevated to 873 K while the Hall effect was being measured, its electrical characteristics remained extraordinarily stable. That fact indicated that the lithium atoms present in the lattice interstices were being steadied by the nitrogen atoms present in the substitutional sites.

Moreover, the 0.11 eV value for the activation energy in measuring the electrical characteristics was close to the theoretical value of 0.10 eV for the activation energy in the ab initio calculation for the situation in which the center-to-center distance between the lithium atoms and the nitrogen atoms is 0.1494 nm, which allowed the fact that the separation between the lithium and nitrogen atoms within the formed diamond single crystal was approximately 0.15 nm to be verified.

INDUSTRIAL APPLICABILITY

According to the present invention, an n-type semiconductor diamond of low resistivity that to date has not existed can be obtained by implanting lithium atoms and nitrogen atoms simultaneously into diamond.

Utilizing the n-type semiconductor diamond of low resistivity makes it possible to fabricate power devices that can withstand operation at high frequency and high output power under high temperatures, light-emitting devices that enable the emission of ultraviolet rays, as well as electron-discharging devices that can be driven at low voltage.

The invention claimed is:

1. Low-resistivity n-type semiconductor diamond characterized in containing $10^{17}$ cm$^{-3}$ or more of lithium atoms and nitrogen atoms together; wherein:

the lithium-atom concentration $C_{Li}$ and the nitrogen-atom concentration $C_N$ within the low-resistivity n-type semiconductor diamond are $0.1 \leq C_{Li}/C_N \leq 10.0$; and the center-to-center distance between the lithium atoms and nitrogen atoms is from 0.145 nm to 0.155 nm.

2. Low-resistivity n-type semiconductor diamond as set forth in claim 1, wherein the low-resistivity n-type semiconductor diamond is a single-crystal diamond.

3. Low-resistivity n-type semiconductor diamond as set forth in claim 1, wherein:

lithium atoms are doped into interstitial lattice sites between carbon atoms constituting the diamond, and nitrogen atoms are doped into sites where they replace the carbon atoms; and the lithium atoms and the nitrogen atoms hold arrangements that neighbor each other.

4. Low-resistivity n-type semiconductor diamond as set forth in claim 3, characterized in having an activation energy of from 0.05 eV to 0.2 eV.

5. Low-resistivity n-type semiconductor diamond as set forth in claim 3, characterized in having a resistivity of $10^3$ Ω·cm or less.

6. A method of manufacturing by a vapor synthesis technique onto a substrate low-resistivity n-type semiconductor diamond doped with lithium atoms and nitrogen atoms together, comprising photo-dissociating a source material by photoexcitation utilizing vacuum ultraviolet light.

7. A method of manufacturing low-resistivity n-type semiconductor diamond as set forth in claim 6, further comprising irradiating an oxide of lithium set inside a chamber with an excimer laser beam to scatter lithium atoms from the oxide.

8. A method of manufacturing low-resistivity n-type semiconductor diamond as set forth in claim 6, wherein source materials for the nitrogen and carbon are in gaseous form, and their supply quantities are $0.001 \leq$ nitrogen amt./carbon amt. $\leq 0.1$.

9. A method of manufacturing low-resistivity n-type semiconductor diamond as set forth in claim 8, wherein the nitrogen source material is nitrogen gas or ammonia.

10. A method of manufacturing low-resistivity n-type semiconductor diamond as set forth in claim 6, wherein the wavelength of the vacuum ultraviolet light is 65 nm or more but 75 nm or less.

11. A method of manufacturing low-resistivity n-type semiconductor diamond as set forth in claim 7, wherein during the vapor synthesis the pressure is from 1330 Pa to 20,000 Pa.

12. A method of manufacturing low-resistivity n-type semiconductor diamond as set forth in claim 6, wherein during the vapor synthesis the substrate temperature is 100° C. or more but 1000° C. or less.

13. Low-resistivity n-type semiconductor diamond as set forth in claim 1, wherein the low-resistivity n-type semiconductor diamond is a single-crystal diamond.

\* \* \* \* \*